(12) United States Patent
Disney

(10) Patent No.: US 7,786,533 B2
(45) Date of Patent: Aug. 31, 2010

(54) HIGH-VOLTAGE VERTICAL TRANSISTOR WITH EDGE TERMINATION STRUCTURE

(75) Inventor: Donald Ray Disney, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 11/050,072

(22) Filed: Feb. 3, 2005

(65) Prior Publication Data

US 2005/0167749 A1 Aug. 4, 2005

Related U.S. Application Data

(63) Continuation-in-part of application No. 10/393,759, filed on Mar. 21, 2003, now Pat. No. 6,882,005, which is a continuation of application No. 09/948,930, filed on Sep. 7, 2001, now Pat. No. 6,573,558.

(51) Int. Cl.
*H01L 27/088* (2006.01)

(52) U.S. Cl. ............... 257/341; 257/488; 257/E29.009; 438/454

(58) Field of Classification Search ......... 257/328–333, 257/341, 342, 401, 409, 487, 488, 496, 520, 257/135, E29.009, E29.011, E29.012, E29.014; 438/140, 192, 454
See application file for complete search history.

(56) References Cited

U.S. PATENT DOCUMENTS

| | | | |
|---|---|---|---|
| 4,343,015 A | 8/1982 | Baliga et al. | |
| 4,531,173 A | 7/1985 | Yamada | |
| 4,618,541 A | 10/1986 | Forouhi et al. | |
| 4,626,789 A | 12/1986 | Nakata et al. | |
| 4,626,879 A | 12/1986 | Colak | |
| 4,665,426 A | 5/1987 | Allen et al. | |
| 4,672,410 A * | 6/1987 | Miura et al. | ................. 257/302 |
| 4,738,936 A | 4/1988 | Rice | |
| 4,754,310 A | 6/1988 | Coe | |
| 4,764,800 A | 8/1988 | Sander | |

(Continued)

FOREIGN PATENT DOCUMENTS

CN 1469487 A * 1/2004

(Continued)

OTHER PUBLICATIONS

"High Voltage Thin Layer Devices (RESURF Devices)," Apples and Vaes, IEDM Tech Digest, Dec. 3-4-5, 1979, pp. 238-241.

(Continued)

*Primary Examiner*—Thao X Le
*Assistant Examiner*—William F Kraig
(74) *Attorney, Agent, or Firm*—The Law Offices of Bradley J. Bereznak

(57) ABSTRACT

A high-voltage transistor includes a drain, a source, and one or more drift regions extending from the drain toward the source. A field plate member laterally surrounds the drift regions and is insulated from the drift regions by a dielectric layer. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR 1.72(b).

19 Claims, 13 Drawing Sheets

U.S. PATENT DOCUMENTS

| | | | |
|---|---|---|---|
| 4,769,685 A * | 9/1988 | MacIver et al. | 257/260 |
| 4,796,070 A | 1/1989 | Black | |
| 4,811,075 A | 3/1989 | Eklund | |
| 4,890,144 A | 12/1989 | Teng et al. | |
| 4,890,146 A | 12/1989 | Williams et al. | |
| 4,922,327 A | 5/1990 | Mena et al. | |
| 4,926,074 A | 5/1990 | Singer et al. | |
| 4,926,243 A | 5/1990 | Nakagawa et al. | |
| 4,929,987 A | 5/1990 | Einthoven | |
| 4,939,566 A | 7/1990 | Singer et al. | |
| 4,963,951 A | 10/1990 | Adler et al. | |
| 4,967,246 A | 10/1990 | Tanaka | |
| 5,008,794 A | 4/1991 | Leman | |
| 5,010,024 A | 4/1991 | Allen et al. | |
| 5,025,296 A | 6/1991 | Fullerton et al. | |
| 5,040,045 A | 8/1991 | McArthur et al. | |
| 5,068,700 A | 11/1991 | Yamaguchi et al. | |
| 5,072,266 A | 12/1991 | Bulucea et al. | |
| 5,072,268 A | 12/1991 | Rumennik et al. | |
| 5,072,269 A * | 12/1991 | Hieda | 257/302 |
| 5,122,848 A | 6/1992 | Lee et al. | |
| 5,126,807 A * | 6/1992 | Baba et al. | 257/401 |
| 5,146,298 A | 9/1992 | Eklund | |
| 5,155,574 A | 10/1992 | Yamaguchi | |
| 5,164,891 A | 11/1992 | Keller | |
| 5,237,193 A | 8/1993 | Williams et al. | |
| 5,258,636 A | 11/1993 | Rumennik et al. | |
| 5,270,264 A | 12/1993 | Andideh et al. | |
| 5,274,259 A | 12/1993 | Grabowski et al. | |
| 5,285,367 A | 2/1994 | Keller | |
| 5,294,824 A | 3/1994 | Okada | |
| 5,306,656 A | 4/1994 | Williams et al. | |
| 5,313,082 A | 5/1994 | Eklund | |
| 5,323,044 A | 6/1994 | Rumennik et al. | |
| 5,324,683 A | 6/1994 | Fitch et al. | |
| 5,326,711 A | 7/1994 | Malhi | |
| 5,349,225 A | 9/1994 | Redwine et al. | |
| 5,359,221 A | 10/1994 | Miyamoto et al. | |
| 5,386,136 A | 1/1995 | Williams et al. | |
| 5,438,215 A | 8/1995 | Tihanyi | |
| 5,473,180 A | 12/1995 | Ludikhuize | |
| 5,514,608 A | 5/1996 | Williams et al. | |
| 5,521,105 A | 5/1996 | Hsu et al. | |
| 5,550,405 A | 8/1996 | Cheng et al. | |
| 5,578,508 A * | 11/1996 | Baba et al. | 438/270 |
| 5,637,898 A | 6/1997 | Baliga | |
| 5,648,283 A | 7/1997 | Tsang et al. | |
| 5,654,206 A | 8/1997 | Merrill | |
| 5,656,543 A | 8/1997 | Chung | |
| 5,659,201 A | 8/1997 | Wollensen | |
| 5,661,322 A | 8/1997 | Williams et al. | |
| 5,663,599 A | 9/1997 | Lur | |
| 5,665,994 A | 9/1997 | Palara | |
| 5,670,828 A | 9/1997 | Cheung et al. | |
| 5,679,608 A | 10/1997 | Chevy et al. | |
| 5,716,887 A | 2/1998 | Kim | |
| 5,760,440 A | 6/1998 | Kitamura et al. | |
| 5,763,915 A * | 6/1998 | Hshieh et al. | 257/330 |
| 5,821,144 A | 10/1998 | D'Anna et al. | |
| 5,869,875 A | 2/1999 | Herbert | |
| 5,917,216 A | 6/1999 | Floyd et al. | |
| 5,929,481 A | 7/1999 | Hshieh et al. | |
| 5,943,595 A | 8/1999 | Akiyama et al. | |
| 5,969,408 A * | 10/1999 | Perelli | 257/620 |
| 5,973,360 A | 10/1999 | Tihanyi | |
| 5,998,833 A | 12/1999 | Baliga | |
| 6,010,926 A | 1/2000 | Rho et al. | |
| 6,040,600 A | 3/2000 | Uenishi | |
| 6,049,108 A * | 4/2000 | Williams et al. | 257/341 |
| 6,054,752 A | 4/2000 | Hara et al. | |
| 6,069,043 A * | 5/2000 | Floyd et al. | 438/270 |
| 6,084,277 A | 7/2000 | Disney | |
| 6,097,063 A | 8/2000 | Fujihira | |
| 6,127,703 A | 10/2000 | Letavic et al. | |
| 6,133,607 A | 10/2000 | Funaki et al. | |
| 6,168,983 B1 | 1/2001 | Rumennik et al. | |
| 6,184,555 B1 | 2/2001 | Tihanyi et al. | |
| 6,191,447 B1 | 2/2001 | Baliga | |
| 6,194,283 B1 | 2/2001 | Gardner et al. | |
| 6,207,994 B1 | 3/2001 | Rumennik et al. | |
| 6,294,818 B1 | 9/2001 | Fujihira | |
| 6,316,807 B1 | 11/2001 | Fujishima et al. | |
| 6,353,252 B1 | 3/2002 | Yasuhara et al. | |
| 6,359,308 B1 | 3/2002 | Hijzen et al. | |
| 6,362,064 B2 | 3/2002 | McGregor | |
| 6,365,932 B1 | 4/2002 | Kouno et al. | |
| 6,388,286 B1 | 5/2002 | Baliga | |
| 6,404,009 B1 * | 6/2002 | Mori | 257/335 |
| 6,424,007 B1 | 7/2002 | Disney | |
| 6,462,377 B2 | 10/2002 | Hurky et al. | |
| 6,465,291 B1 | 10/2002 | Disney | |
| 6,468,847 B1 | 10/2002 | Disney | |
| 6,489,190 B2 | 12/2002 | Disney | |
| 6,501,130 B2 | 12/2002 | Disney | |
| 6,504,209 B2 | 1/2003 | Disney | |
| 6,507,071 B1 | 1/2003 | Tihanyi | |
| 6,509,220 B2 | 1/2003 | Disney | |
| 6,525,372 B2 | 2/2003 | Baliga | |
| 6,552,597 B1 | 4/2003 | Disney et al. | |
| 6,555,873 B2 | 4/2003 | Disney et al. | |
| 6,555,883 B1 | 4/2003 | Disney et al. | |
| 6,563,171 B2 | 5/2003 | Disney | |
| 6,570,219 B1 | 5/2003 | Rumennik et al. | |
| 6,573,558 B2 | 6/2003 | Disney | |
| 6,583,663 B1 | 6/2003 | Disney et al. | |
| 6,621,107 B2 * | 9/2003 | Blanchard et al. | 257/155 |
| 6,630,698 B1 | 10/2003 | Deboy | |
| 6,633,065 B2 | 10/2003 | Rumennik et al. | |
| 6,635,544 B2 | 10/2003 | Disney | |
| 6,639,277 B2 | 10/2003 | Rumennik et al. | |
| 6,667,213 B2 | 12/2003 | Disney | |
| 6,677,641 B2 | 1/2004 | Kocon | |
| 6,680,646 B2 | 1/2004 | Disney | |
| 6,683,346 B2 | 1/2004 | Zeng | |
| 6,724,041 B2 | 4/2004 | Rumennik et al. | |
| 6,734,714 B2 | 5/2004 | Disney | |
| 6,750,105 B2 | 6/2004 | Disney et al. | |
| 6,750,508 B2 * | 6/2004 | Omura et al. | 257/329 |
| 6,759,289 B2 | 7/2004 | Disney | |
| 6,764,889 B2 | 7/2004 | Baliga | |
| 6,768,171 B2 | 7/2004 | Disney | |
| 6,768,172 B2 | 7/2004 | Rumennik et al. | |
| 6,777,749 B2 | 8/2004 | Rumennik et al. | |
| 6,781,194 B2 | 8/2004 | Baliga | |
| 6,781,198 B2 | 8/2004 | Disney | |
| 6,787,437 B2 | 9/2004 | Rumennik et al. | |
| 6,787,847 B2 | 9/2004 | Disney | |
| 6,787,848 B2 | 9/2004 | Ono et al. | |
| 6,798,020 B2 | 9/2004 | Disney et al. | |
| 6,800,903 B2 | 10/2004 | Rumennik et al. | |
| 6,809,354 B2 * | 10/2004 | Okada et al. | 257/213 |
| 6,815,293 B2 | 11/2004 | Disney et al. | |
| 6,818,490 B2 | 11/2004 | Disney | |
| 6,825,536 B2 | 11/2004 | Disney | |
| 6,828,631 B2 | 12/2004 | Rumennik et al. | |
| 6,838,346 B2 | 1/2005 | Disney | |
| 6,865,093 B2 | 3/2005 | Disney | |
| 6,882,005 B2 | 4/2005 | Disney | |
| 6,987,299 B2 | 1/2006 | Disney | |
| 7,115,958 B2 | 10/2006 | Disney et al. | |
| 7,135,748 B2 | 11/2006 | Balakrishnan | |
| 7,183,610 B2 * | 2/2007 | Pattanayak et al. | 257/333 |
| 7,220,629 B2 | 5/2007 | Balakrishnan | |
| 7,221,011 B2 | 5/2007 | Banerjee et al. | |

| | | | |
|---|---|---|---|
| 7,227,225 B2 * | 6/2007 | Ono et al. ................... 257/331 |
| 7,253,042 B2 | 8/2007 | Disney et al. |
| 7,253,059 B2 | 8/2007 | Balakrishnan |
| 7,335,944 B2 | 2/2008 | Banerjee |
| 7,381,618 B2 | 6/2008 | Disney |
| 7,391,088 B2 | 6/2008 | Balakrishnan |
| 7,408,223 B2 * | 8/2008 | Hueting ...................... 257/328 |
| 7,482,654 B2 * | 1/2009 | Cao et al. ................... 257/339 |
| 7,485,932 B2 * | 2/2009 | Thapar ....................... 257/369 |
| 2001/0015459 A1 | 8/2001 | Watanabe et al. |
| 2002/0056884 A1 | 5/2002 | Baliga |
| 2002/0175351 A1 | 11/2002 | Baliga |
| 2003/0209757 A1 * | 11/2003 | Henninger et al. .......... 257/329 |

FOREIGN PATENT DOCUMENTS

| | | |
|---|---|---|
| DE | 43 09 764 | 9/1994 |
| EP | 0308612 | 10/1994 |
| EP | 1073 123 A2 | 7/2000 |
| GB | 2 309 336 A | 1/1997 |
| JP | 52-178218 | 1/1978 |
| JP | 56-38867 | 4/1981 |
| JP | 57-10975 | 1/1982 |
| JP | 57-12557 | 1/1982 |
| JP | 57-12558 | 1/1982 |
| JP | 60-64471 A | 4/1985 |
| JP | 1-238037 | 9/1989 |
| JP | 3-211771 | 9/1991 |
| JP | 4107877 A | 4/1992 |
| JP | 04-107867 | 7/1992 |
| JP | 6-120510 | 4/1994 |
| JP | 6-196630 | 7/1994 |
| JP | 6-224426 | 8/1994 |
| JP | 9-266311 | 10/1997 |
| JP | 2000-12854 | 1/2000 |
| JP | 200-349288 A | 12/2000 |
| JP | 2001-085688 A | 3/2001 |
| JP | 2002-43562 | 2/2002 |
| WO | WO 97/35346 | 9/1997 |
| WO | WO 99/34449 | 7/1999 |
| WO | WO 00/33385 | 6/2000 |
| WO | WO 02/41402 A2 | 5/2002 |
| WO | WO 02/099909 A1 | 12/2002 |

OTHER PUBLICATIONS

"Realization of High Breakdown Voltage (>700V) in Thin SOI Devices," S. Merchan, et al., Phillips Laboratories North America, 1991 IEEE, pp. 31-35.

Patent Abstract of Japan, Kawasaki, et al., vol. 16, No. 347(E-1240), JP04-107867, Jul. 27, 1992.

"Theory of Semiconductor Superjunction Devices," Fujihira, Japan Journal of Applied Physics vol. 36, Oct. 1997, pp. 6254-6262.

"Air-Gap Formation During IMD Deposition to Lower Interconnect Capacitance," Shieh, et al., IEEE Electron Device Letters vol. 17 No. 1, Jan. 1998.

Oxide-Bypassed VDMOS (OBVDMOS): An Alternative to Superjunction High-Voltage MOS Power Devices, Liang, et al., IEEE Electron Devices Letters, vol. 22, No. 8, Aug. 8, 2001, pp. 407-409.

"Comparison of High-Voltage Devices for Power Integrated Circuits," Anaman, et al., IEDM 84, pp. 258-261.

"A New Generation of High-Voltage MOSFETs Breaks the Limit Line of Silicon," Debby, et al. Siemens AG, Munchen, Germany, IEDM 98-683-IEDM 98-685, 1998.

"High Performance 600V Smart Power Technology Based on Thin Layer Silicon-on-Insulators," Letavic, et al, Phillips Research, 4 pages.

"Modern Semiconductor Device Physics," Sze, et al., John Wiley & Sons, Chapter 4 ("Power Devices"), 1998, pp. 203-206.

"Modeling and Optimisation of Lateral High Voltage IC Devices to Minimize 3-D Effects," Hamza Yilmaz, R&D Engineering, General Electric Co., NC, pp. 290-294.

"Optimization of the Specific On-Resistance of the COOLMOS™," Chen, et al., IEEE Transactions on Electron Devices, vol. 48, No. 2, Feb. 1, pp. 344-348.

"Lateral Unbalanced Super Junction (USJ) / 3D-RESURF for High Breakdown Voltage on SOI," Ng, et al., Apr. 6, 2001, pp. 395-398.

"Static and Dynamic Electricity," William R. Smythe, McGraw hill Book Company, Inc., New York, 1950.

* cited by examiner

HIGH-VOLTAGE VERTICAL TRANSISTOR WITH EDGE TERMINATION STRUCTURE

RELATED APPLICATIONS

This is a continuation-in-part (CIP) application of application Ser. No. 10/393,759 filed Mar. 21, 2003, which is a continuation of Ser. No. 09/948,930 filed Sep. 7, 2001, now U.S. Pat. No. 6,573,558, both of which are assigned to the assignee of the present CIP application.

FIELD OF THE INVENTION

The present invention relates to semiconductor devices fabricated in a silicon substrate. More specifically, the present invention relates to field-effect semiconductor transistor structures capable of withstanding high voltages.

BACKGROUND OF THE INVENTION

High-voltage, field-effect transistors (HVFETs) are well known in the semiconductor arts. Most often, HVFETs comprise a device structure that includes an extended drain region that supports the applied high-voltage when the device is in the "off" state. HVFETs of this type are commonly used in power conversion applications such as AC/DC converters for offline power supplies, motor controls, and so on. These devices can be switched at high voltages and achieve a high blocking voltage in the off state while minimizing the resistance to current flow in the "on" state. The blocking or breakdown voltage is generally denoted as Vbd. The acronym Rsp refers to the product of the resistance and surface area, and is generally used to describe the on-state performance of the device. An example of a prior art HVFET having an extended drain region with a top layer of a conductivity type opposite that of the extended drain region is found in U.S. Pat. No. 4,811,075.

In a conventional HVFET the extended drain region is usually lightly doped to support high voltages applied to the drain when the device is off. The length of the extended drain region is also increased to spread the electric field over a larger area so the device can sustain higher voltages. However, when the device is on (i.e., conducting) current flows through the extended drain region. The combined decrease in doping and increase in length of the extended drain region therefore have the deleterious effect on the on-state performance of the device, as both cause an increase in on-state resistance. In other words, conventional high-voltage FET designs are characterized by a trade-off between Vbd and Rsp.

To provide a quantitative example, a typical prior art vertical HVFET (NMOS-type) may have a Vbd of 600V with a Rsp of about 16 ohm-mm$^2$. Increasing the length of the extended drain would affect device performance by increasing Vbd beyond 600V at the expense of a higher Rsp value. Conversely, reducing the length of the extended drain would improve the on-state resistance to a value below 16 ohm-mm$^2$, but such a change in the device structure would also cause Vbd to be reduced to less than 600V.

A device structure for supporting higher Vbd voltages with a low Rsp value is disclosed in U.S. Pat. Nos. 4,754,310, 5,438,215, and also in the article entitled, "*Theory of Semiconductor Superjunction Devices*" by T. Fujihira, Jpn. J. Appl. Phys., Vol. 36, pp. 6254-6262, October 1977. In this device structure the extended drain region comprises alternating layers of semiconductor material having opposite conductivity types, e.g., PNPNP . . . . As high voltage is applied to the layers of one conductivity type, all of the layers are mutually depleted of charge carriers. This permits a high Vbd at much higher conducting layer doping concentrations as compared to single layer devices. The higher doping concentrations, of course, advantageously lower the Rsp of the transistor device. For example, in the article entitled, "*A new generation of high voltage MOSFETs breaks the limit line of silicon*" by G. Deboy et al., IEDM tech. Digest, pp. 683-685, 1998, the authors report a vertical NMOS device with a Vbd of 600V and a Rsp of about 4 ohm-mm$^2$.

Another approach to the problem of achieving high-voltage capability is disclosed in the paper, "*Realization of High Breakdown Voltage in Thin SOI Devices*" by S. Merchant et al., Proc. Intl. Symp. on Power Devices and ICs, pp. 31-35, 1991. This paper teaches an extended drain region that comprises a thin layer of silicon situated on top of a buried oxide layer disposed on top of a semiconductor substrate. In operation, the underlying silicon substrate depletes charge from the thin silicon layer at high voltages. The authors claim that high values of Vbd are obtained as long as the top silicon layer is sufficiently thin and the buried oxide layer is sufficiently thick. For instance, a lateral NMOS device with Vbd of 600V and Rsp of about 8 ohm-mm$^2$ is obtained using this approach.

Other background references of possible interest to those skilled in the art include U.S. Pat. Nos. 6,184,555, 6,191,447, 6,075,259, 5,998,833, 5,637,898, International Application No. PCT/IB98/02060 (International Publication No. WO 99/34449), and the article, "*High Performance 600V Smart Power Technology Based on Thin Layer Silicon-on-Insulator*" by T. Letavic et al., Proc. ISPSD, pp. 49-52, 1997.

Another problem associated with conventional HVFET designs is that they usually require a wide perimeter or edge termination area in order to support the large electric fields developed between the various regions. By way of example, a conventional HVFET design may require an edge termination area in a range of 200 μm-300 μm wide for a 600V device. Naturally, this wide edge termination area uses valuable silicon area leading to increased production costs.

What is needed, therefore, is an improved high-voltage transistor structure that achieves a high Vbd with relatively low on-state resistance while also minimizing the edge termination area that separates the active device cells from the perimeter area.

BRIEF DESCRIPTION OF THE DRAWINGS

The present invention is illustrated by way of example, and not limitation, in the figures of the accompanying drawings, wherein.

DETAILED DESCRIPTION

A high-voltage field-effect transistor (HVFET) having an extended drain or drift region with an edge termination structure is described. The HVFET has a low specific on-state resistance and supports high voltage in the off-state. In the following description, numerous specific details are set forth, such as material types, doping levels, structural features, processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

Figure 1:
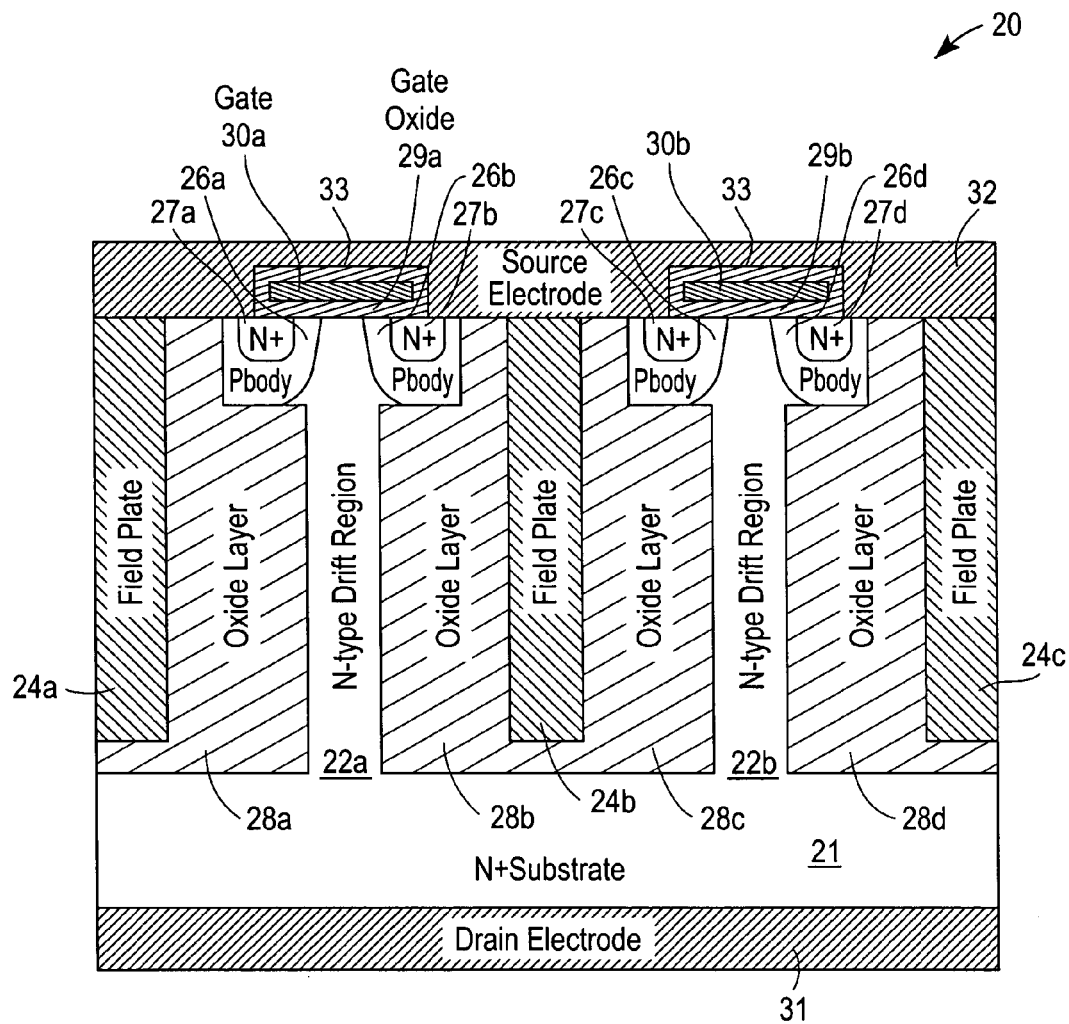
FIG. 1 is a cross-sectional side view of a vertical high-voltage, field-effect transistor (HVFET) device structure in accordance with one embodiment of the present invention.

FIG. 1 is a cross-sectional side view of a vertical n-channel (i.e., NMOS) HVFET 20 in accordance with one embodiment of the present invention. It should be understood that the elements in the figures are representational, and are not drawn to scale in the interest of clarity. It is also appreciated that a p-channel transistor may be realized by utilizing the opposite conductivity types for all of the illustrated diffusion/doped regions. Furthermore, although the figure appears to show two separate devices, those of skill will understand that such transistor structures are commonly fabricated in an annular, inter-digitated, or otherwise replicated manner.

The device structure of FIG. 1 includes an insulated-gate, field-effect transistor (IGFET) having a gate 30 (comprised, for example, of polysilicon), and a gate-insulating layer 29 that insulates gate 30 from the underlying semiconductor regions. Gate-insulating layer 29 may comprise ordinary silicon dioxide or another appropriate dielectric insulating material. The extended drain region of vertical HVFET 20 comprises one or more N-type drift regions 22 situated between p-type body regions 26 and extending down to the N+ substrate 21. For instance, FIG. 1 shows drift region 22*a* extending from beneath gate oxide 29*a* between P-body regions 26*a* & 26*b* down to N+ substrate 21. Similarly, drift region 22*b* extends from gate oxide 29*b* between P-body regions 26*c* & 26*d* down to N+ substrate 21.

Source electrode 32 is electrically connected to N+ source regions 27, which are disposed in respective P-body regions 26. For example, N+ source region 27*a* is disposed in P-body region 26*a*; N+ region 27*b* is disposed in P-body region 27*b*, and so on. It is appreciated that a variety of alternative source electrode connections are also possible. The area of the P-body regions directly beneath gate 30 comprises the IGFET channel region of the transistor. In this particular embodiment, the gate region is a metal-oxide semiconductor (MOS), and the IGFET is a NMOS transistor. Thus, the channel regions of HVFET 20 are defined at one end by N+ source regions 27 and at the other end by N-type drift regions 22, which extend vertically from gate oxide 29 down to the N+ substrate 21. Insulating layers 33 separate gate 30 from source electrode 32.

The n-type extended drain or drift regions 22 are separated laterally by insulating regions or dielectric layers 28. In the embodiment of FIG. 1, dielectric layers 28 extend vertically from beneath P-body regions 26 down to N+ substrate 21 along the full vertical length of the drift regions 22. By way of example, dielectric layers 28 may comprise silicon dioxide, but other insulating materials, such as silicon nitride, may also be used. Disposed within each of the dielectric layers 28, and fully insulated from the semiconductor substrate 21 and drift regions 22, is a field plate member 24. Field plate members 24 comprise a conducting layer of material such as heavily doped polysilicon, metal, metal alloys, etc. As shown in the embodiment of FIG. 1, each of the field plate members 24 is electrically connected to source electrode 32. Alternatively, the field plate members may be connected to a separate electrode. Gates 30 are also connected to a separate electrode (not shown). Drain electrode 31 provides electrical connection to the bottom of N+ substrate 21.

The extended drain region of vertical NMOS high-voltage transistor 20 of FIG. 1 consists of a plurality of laterally interleaved layers of doped semiconductor material (e.g., n-type), insulating material (e.g., silicon dioxide), and conducting material (e.g., heavily-doped polysilicon). In the on state, a sufficient voltage is applied to the gate such that a channel of electrons is formed along the surface of the P-body regions 26. This provides a path for electron current flow from source electrode 32, N+ source regions 27, through the channel regions formed in P-body regions 26, down through the N-type drift regions 22, through the N+ substrate 21, to drain electrode 31.

Practitioners in the semiconductor arts will note that in a conventional vertical HVNMOS transistor, the N-type drift region is normally very thick (i.e., long) and lightly doped; both of which contribute to high on state resistance. In the device structure of FIG. 1, on the other hand, the doping in the N-type drift regions may be considerably higher, such that the on-state resistance is dramatically lowered.

In the off state, a high voltage (e.g., 200V-1200V) is applied across the respective drain and source electrodes 31 and 32. As the voltage increases, the presence of field plate regions 24 on opposite sides of drift regions 22 cause the N-type drift regions to become depleted of free carriers. The doping profile in the drift regions 22 may be tailored such that the resulting electric field is approximately constant along the path from the drain to the source. For example, the doping concentration may be highest near the N+ substrate 21, lowest the near the P-body regions 26, and linearly graded in between. In other embodiments, the doping profile gradient in the drift regions 22 varies (i.e., a different slope) as a function of the vertical depth of the drift region. In other words, the doping profile gradient may be steepest near substrate 21 and shallowest near the P-body regions 26. This aspect of the present invention is discussed in more detail below.

The width of both the N-type drift regions 22 and oxide layers 28 should be designed so as to prevent premature avalanche breakdown. Avalanche breakdown can be avoided by making the drift region relatively narrow, which reduces the ionization path and thereby increases the critical electric field at which avalanche occurs. In the same regard, making oxide layers 28 relatively wide allows the device structure to support a larger voltage for a given electric field.

By way of example, a device manufactured in accordance with FIG. 1 having a drift region that is about 50 μm high and about 2.0 µm wide, with an oxide layer width of approximately 4.0 µm is capable of supporting about 600V. In such a device, the doping in the drift region may be linearly graded from about $2 \times 10^{15}$ cm$^{-3}$ near the P-body regions to about $4 \times 10^{16}$ cm$^{-3}$ near the N+ substrate. The on-state resistance of such a device is about 1.7 ohm-mm$^2$.

Practitioners in the art will appreciate that the device performance for HVFET 20 may be improved when manufactured as a smaller total cell pitch (i.e., combined width of field plate, oxide layer and drift regions) because the contribution of each drift region is fairly constant.

Figure 2:
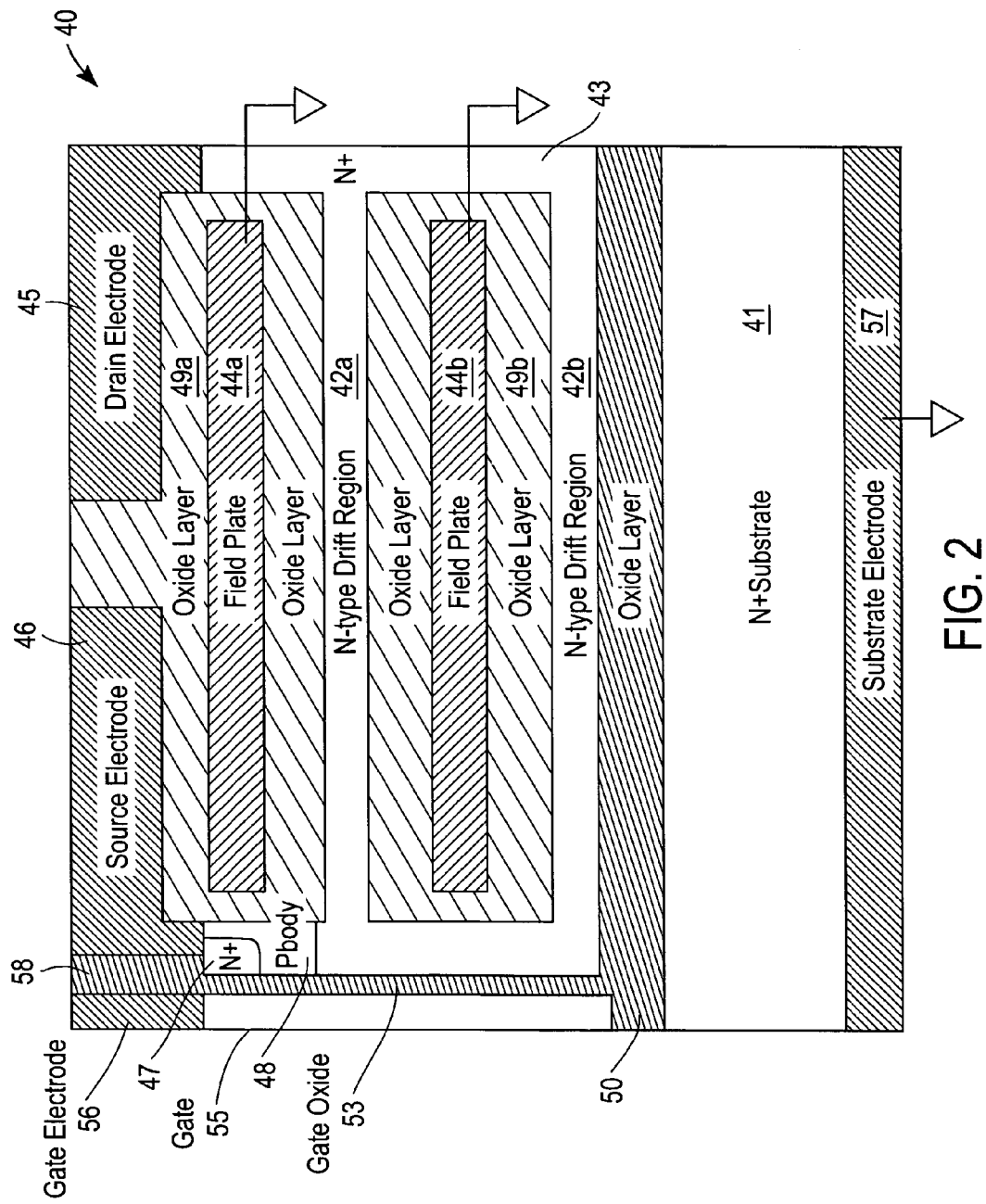
FIG. 2 is a cross-sectional side view of one embodiment of a lateral HVFET fabricated in accordance with the present invention.

Referring now to FIG. 2, there is shown a lateral NMOS high-voltage transistor 40 in accordance with another embodiment of the present invention. HVFET 40 of FIG. 2 operates according to the same principles discussed in connection with the transistor structure of FIG. 1, except that current flows laterally, as opposed to vertically, through the drift regions. Note that in the embodiment of FIG. 2, field plate members 44 are fully insulated from the semiconductor material by oxide layers 49.

In this example, field plate member 44a is disposed within oxide layer 49a just below the source and drain electrodes 46 and 45, respectively. Field plate member 44b is disposed within oxide layer 49b below N-type drift region 42a and above N-type drift region 42b. The field plate members may be connected to a field plate electrode at a certain location out of the plane of the figure. The N-type drift region, which comprises the extended drain of the transistor, extends laterally from beneath P-body region 48 across to N+ drain region 43. N+ drain region 43 connects both drift regions 42a & 42b with drain electrode 45.

An N+ source region 47, which is electrically connected to source electrode 46, is disposed adjacent P-body region 48. The HVFET 40 utilizes a vertical MOS gate structure 12 that comprises a gate electrode 56 that connects to gate 55. In this embodiment, gate 55 comprises a layer of polysilicon that extends vertically from gate electrode 56. Gate 55 extends below the P-body region, and may extend down to oxide layer 50, as shown. Gate 55 is insulated from N+ source region 47, P-body region 48, and N-type drift region 42 by gate oxide 53. An oxide region 58 separates gate electrode 56 from source electrode 46.

Oxide layer 50 insulates N+ substrate 41 from gate 55, N-type drift region 42, and N+ drain region 43. As can be seen, oxide layer 50 extends laterally over N+ substrate 41 beneath each of the regions 42, 43, and 55. Substrate electrode 57 provides electrical connection to the bottom of N+ substrate 41. The substrate may serve as the bottom field plate for drift region 42b.

The on-state and off-state operations of HVFET 40 are similar to those described for the embodiment of FIG. 1. In this case, however, the source and drain electrodes are located on the top surface. This means that electrons flows down through N+ source region 47, across the channel region formed in P-body region 48 adjacent to gate oxide 53, laterally across the N-type drift regions 42, and up through the N+ drain region 43 before reaching the drain electrode.

Note that even though FIG. 2 shows a trench gate structure, planar gate structures could also be used. Additionally, a trench drain structure could also be used in an alternative implementation. Furthermore, although the embodiment of FIG. 2 shows the extended drain region comprising two laterally extending parallel N-type drift regions 42a and 42b, other embodiments may utilize more than two parallel drift regions. In other words, the embodiment of FIG. 2 is not limited to just two drift regions, but could include any number of layers of drift, oxide, and field plate regions within manufacturing limits.

Figure 3A:
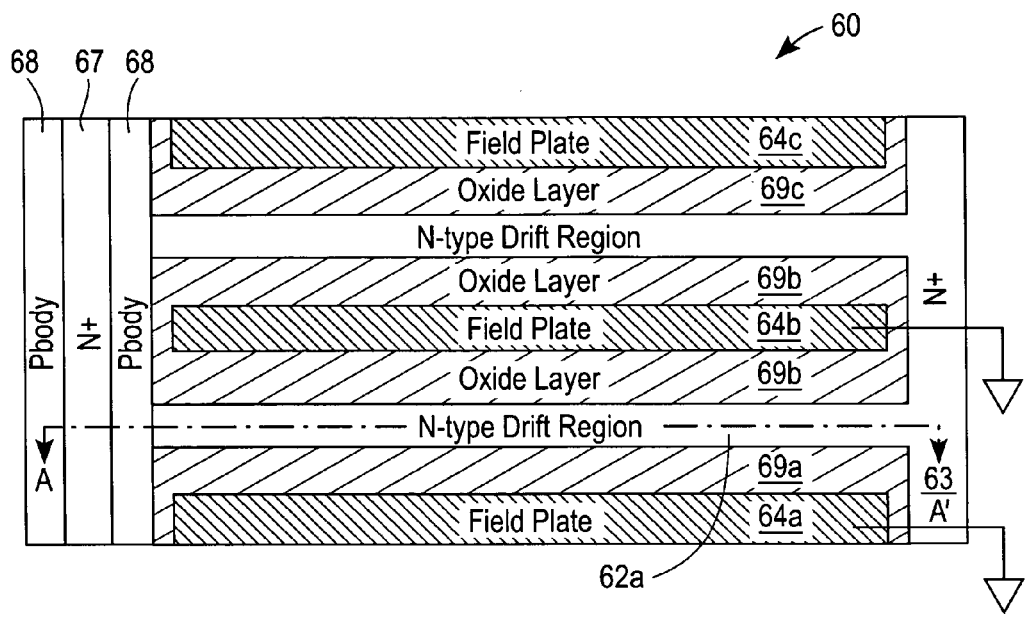
FIG. 3A is a top view of lateral HVFET fabricated in accordance with another embodiment of the present invention.
Figure 3B:
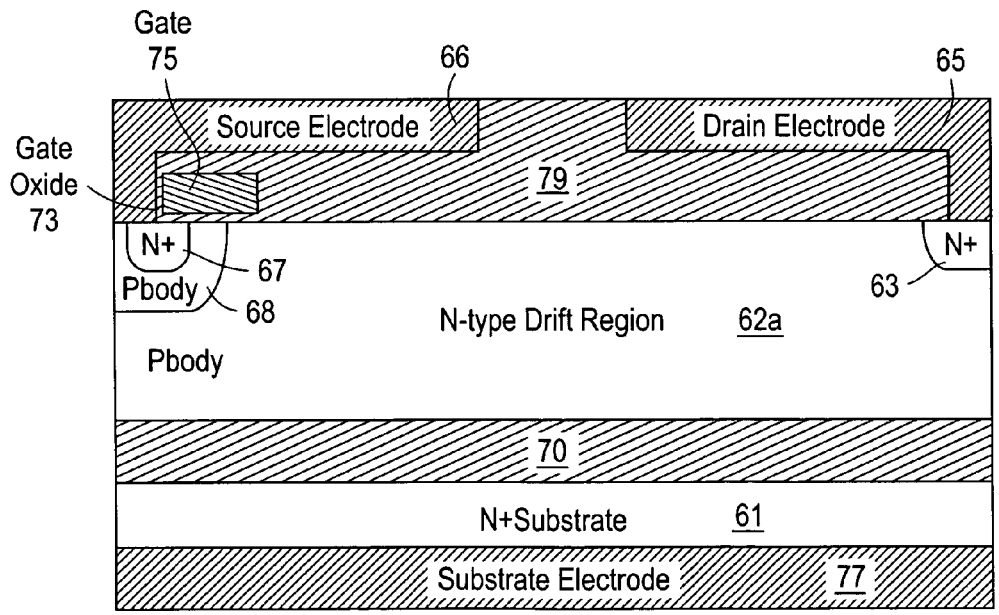
FIG. 3B is a cross-sectional side view of the lateral HVFET shown in FIG. 3A, taken along cut lines A-A'.

FIGS. 3A & 3B illustrate another embodiment of a lateral HVFET in accordance with the present invention. FIG. 3A is a top view of a lateral HVFET transistor 60, and FIG. 3B is a cross-sectional side view of the same device, taken along cut lines A-A', which extends through drift region 62a. (Note that the source electrode 66, drain electrode 65, gate 75, gate oxide 73 and oxide layer 79 are not depicted in FIG. 3A to avoid confusion. These elements are shown in the cross-sectional side view of FIG. 3B.)

The lateral device structure of FIG. 3 is similar to that shown in FIG. 2. But rather than orient the drift, oxide, and field plate layered regions on top of one another (vertically), the embodiment of FIG. 3 has these regions oriented side-by-side. Unlike the embodiment of FIG. 2, each of the N-type drift regions 62, oxide layers 69, and field plate members 64 extend from underlying insulating layer 70 toward the upper substrate surface. Each of the N-type drift regions 62 and field plate members 64 are insulated from N+ substrate 61 by insulating layer 70. In one embodiment, layer 70 comprises silicon dioxide. An additional electrode 77 provides electrical connection to the bottom of N+ substrate 61.

The planar gate and drain configurations of HVFET transistor 60 are illustrated in the side view of FIG. 3B. Alternatively, a trench drain structure and/or a trench gate structure may be utilized. In this embodiment, a gate member 75 is disposed above P-body region 68 and is insulated from the semiconductor substrate by a gate oxide 73. Source electrode 66 contacts N+ source region 67, which is disposed in P-body region 68. P-body region 68 is itself shown disposed in N-type drift region 62.

N+ drain region 63 is disposed at the opposite end of the N-type drift region 62 and is electrically connected to drain electrode 65.

The embodiments of FIGS. 2 and 3 each show the field plate members being coupled to the lowest chip potential, e.g., ground. The source may be tied to the field plate members (at the lowest chip potential), or, alternatively, the source region may be left floating. In other words, the embodiments of FIGS. 1-3 are not limited to a source follower configuration. Each of the transistor structures of the present invention may be implemented as a four-terminal device, wherein the drain, source, field plate members, and insulated gate members are connected to a separate circuit terminal. In another embodiment, the field plate and insulated gate members may be connected together.

Figure 4:
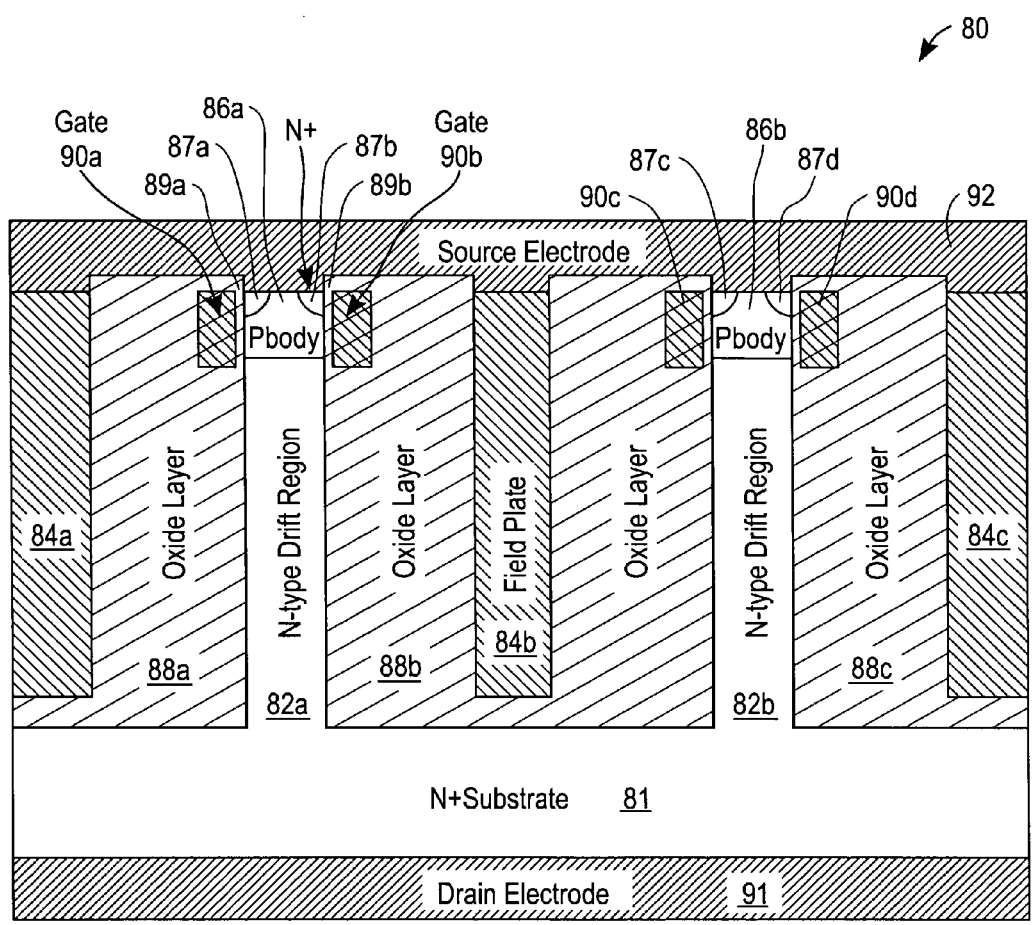
FIG. 4 is a cross-sectional side view of another embodiment of a vertical HVFET device structure fabricated according to the present invention.

With reference now to FIG. 4, there is shown a cross-sectional side view of another embodiment of a vertical HVFET transistor 80 constructed according to the present invention. The device structure shown in FIG. 4 is similar to that of FIG. 1, except that the planar gate has been replaced by a trench gate structure. As in the vertical device structure of FIG. 1, transistor 80 comprises one or more N-type drift regions 82 that extend vertically from P-body regions 86 down to the N+ substrate 81. Each of the drift regions 82 is adjoined on both sides by an oxide layer 88. For example, N-type drift region 82a is bounded on one side by oxide layer 88a and on the opposite side by oxide layer 88b.

Disposed within each of the oxide layers 88, and fully insulated from the drift region and substrate semiconductor materials, is a field plate member 84 that may be electrically connected to source electrode 92. The N-type drift regions 82, oxide layers 88, and field plate members 84 collectively comprise a parallel layered structure that extends in a lateral direction, which is perpendicular to the direction of current flow in the on-state.

The trench gate structure of vertical HVFET transistor 80 comprises gate members 90 disposed between field plate members 84 and P-body regions 86. In the embodiment of FIG. 4, a pair of N+ source regions 87 is disposed in each of P-body regions 86 on opposite sides. Each P-body region 86 is located at one end of a corresponding N-type drift region 82. A thin gate-insulating layer 89 (e.g., oxide) insulates each of gate members 90 (e.g., polysilicon) from the P-body semiconductor material.

For example, FIG. 4 shows gate members 90a & 90b disposed along opposite sides of P-body region 86a. N+ source regions 87a & 87b are disposed in P-body region 86a at opposite sides adjacent to the gate members; both regions 87a & 87b are electrically connected to source electrode 92. A portion of P-body regions 86 extends between the N+ source regions 87 and drift region 82. When transistor 80 is in the on-state conducting channel regions are formed along the sides of P-body region 86a such that current flows from source electrode 92, through N+ regions 87, across P-body 86, down through N-type drift regions 82 and N+ substrate 81, to drain electrode 91.

Practitioners in the art will appreciate that the pair of N+ source regions 87 shown disposed in each P-body region 86 of FIG. 4 may alternatively be replaced by a single N+ region that extends across the full width of region 86 adjacent to source electrode 92. In this case, the P-body region may be connected to the source electrode at various points (dimensionally into the page of the figure.) In one embodiment, source electrode 92 may protrude through N+ source 87 to contact the underlying P-body region 86 (see FIG. 5K).

The trench gate structure of the embodiment of FIG. 4 potentially offers an advantage of a simplified manufacturing process, due to the elimination of the T-shaped semiconductor regions shown in FIG. 1. Also, the vertical HVNMOS structure of transistor 80 may provide lower on-resistance due to the elimination of the JFET structure formed between the P-body regions.

In the embodiment of FIG. 4 the doping concentration in the drain drift region nearest the P-body region (i.e., nearest the source) may have a first gradient, with the doping concentration in the drain drift region farthest from the P-body region (i.e., nearest the drain) having a second gradient, with the latter gradient being larger than the former. In one implementation, the gradient of the doping concentration nearest the drain is at least 10% larger than the gradient of the doping concentration nearest the source.

Practitioners in the semiconductor arts will understand that the electric field component in the vertical direction parallel to the drift region is proportional to the gradient of the doping profile. This means for a given drift length, a transistor device fabricated with a larger single-gradient doping profile is characterized by an off-state breakdown voltage that is higher than a device fabricated with a smaller single-gradient doping profile. In one implementation, HVFET 80 may be fabricated with a linear gradient doping profile in which the portion of the drift region nearer the source has a lower doping concentration as compared to the portion nearest the drain electrode. In another implementation, a multiple-gradient drain doping profile that optimizes both the on-state and off-state breakdown voltages may be utilized. For instance, in the upper section of the drift region nearest the source electrode, the lower doping concentration gradient improves the on-state breakdown voltage by limiting the multiplication factor in this portion of the drift region. At the same time, the lower section of the drift region nearest the drain electrode may have a higher doping concentration gradient, which results in higher electric fields in this portion of the drift region, thereby increasing the off-state breakdown voltage of the device.

By way of further example, in one embodiment of the present invention, a HVFET structure as shown in FIG. 4 with a 600V breakdown voltage may be fabricated with a multi-gradient N-type drift region 22 having a width in a range of about 1 μm-3 μm, a drift region length of about 40 μm-60 μm, and a dielectric layer width (as measured between field plate 24 and drift region 22) of approximately 3 μm-5 μm. The drift region may have a section of constant doping in a range of about $1 \times 10^{15}$ cm$^{-3}$ to $2 \times 10^{15}$ cm$^{-3}$ for the first 0-5 μm below the P-body region. The next lower section of the drift region may have a doping concentration that increases linearly with a first gradient to a concentration of about $1 \times 10^{16}$ cm$^{-3}$ to $2 \times 10^{16}$ cm$^{-3}$ near the middle (vertical depth) of drift region 22. At that point, the doping concentration may increase linearly, but with a higher gradient, to a level of about $4 \times 10^{16}$ cm$^{-3}$ to $5 \times 10^{16}$ cm$^{-3}$ at the drain end of the drift region, i.e., near substrate 81.

It is appreciated that the specific gradients and the drift region depth at which the gradient changes can vary in combination with the drift region width, drift region length, dielectric width, etc., in order to implement a transistor device with higher or lower breakdown voltages in the on and off states. It should also be understood that the concept of a multi-gradient drift region may be utilized in a variety of different transistor structures. For instance, each of the device structures shown in FIGS. 1, 2, 3, 4, 5G, 5K, and 6 (see discussion below) may utilize a multi-gradient drift region doping concentration profile to optimize device performance.

FIGS. 5A-5K illustrates the various processing steps that may be utilized to fabricate a vertical high-voltage transistor in accordance with the present invention. The described fabrication method may be used not only to form the device of FIG. 5K, but also the vertical device structure shown in FIG. 4.

Figure 5A:
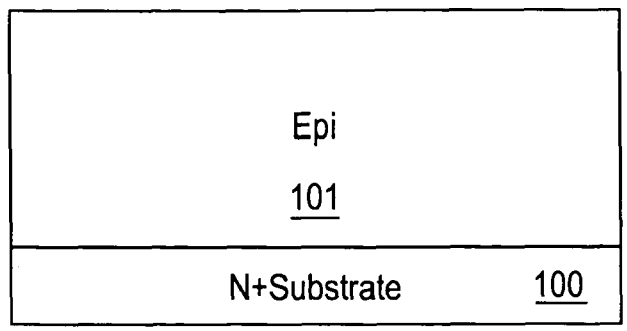
FIGS. 5A-5K are cross-sectional side views of a vertical HVFET device structure taken at various stages in a fabrication process in accordance with yet another embodiment of the present invention.

FIG. 5A shows a vertical high-voltage transistor after the initial processing step of forming an epitaxial layer 101 of n-type semiconductor material on an N+ substrate 100. To support applied voltages in the range of 200V to 1000V the device structure should have an epitaxial layer that is about 15 μm to 120 μm thick. The N+ substrate 100 is heavily doped to minimize its resistance to current flowing through to the drain electrode, which is located on the bottom of the substrate in the completed device. Substrate 100 may be thinned, for example, by grinding or etching, and metal may be deposited on its bottom surface to further reduce the on-resistance of the transistor. Most often, these processing steps would be performed after the topside processing has been completed.

The thickness and doping of epitaxial layer 101 largely determine the breakdown voltage of the device. The doping may be carried out as the epitaxial layer is being formed. For example, the doping concentration may be highest near the drain (at the bottom, adjacent to N+ substrate 100) and lowest near the source (at the top). In certain implementations, linear grading may stop at some point below the top surface of the epitaxial layer 101.

Figure 5B:
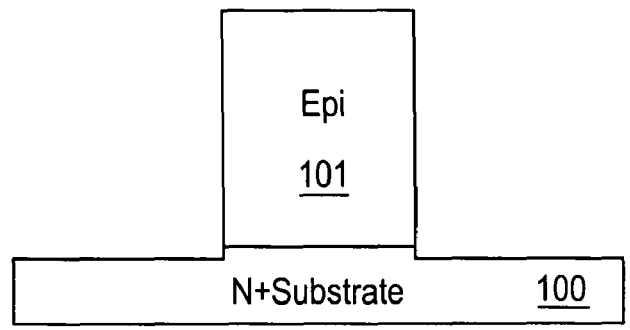

After the epitaxial layer 101 has been formed, the top surface of layer 101 is appropriately masked and deep trenches are then etched into, or alternatively completely through, the epitaxial layer. FIG. 5B shows a cross-sectional view of the device structure following etching of epitaxial layer 101 and part of substrate 100. Note that the lateral width of the etched trenches is determined by the combined thickness of the dielectric and conductive refill layers, as described below.

Spacing between adjacent trenches is determined by the required width of the remaining mesa of epitaxial layer material, which, in turn, is governed by the breakdown voltage requirements of the device. It is this mesa of epitaxial material that eventually forms the N-type drift region of the device structure. It should be understood that this mesa of material might extend a considerable lateral distance in an orthogonal direction (into the page). Although the embodiment of FIG. 5 illustrates a device having an extended drain region that comprises a single N-type drift region, it is appreciated that the vertical high-voltage transistor of FIG. 5 may be constructed with a plurality of parallel-arranged N-type drift regions. Making the width of the N-type drift region(s) narrow allows for high Vbd by limiting the ionization path. In certain implementations, drift regions with larger widths may offer advantages in on-state performance. Therefore, it should be understood that the mesa width may be optimized for a given device requirement and manufacturing capability. In one implementation, the thickness is in the approximate range of 0.4 to 3.0 microns. In this example, the thickness of the mesa is about 1 μm.

Figure 5C:
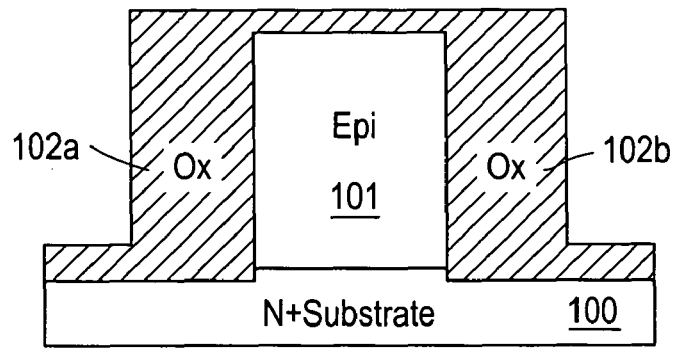

FIG. 5C shows the device structure of FIG. 5B after partial filling of the etched trenches with a dielectric material, e.g., silicon dioxide. As shown, in the embodiment of FIG. 5 oxide region 102a covers one side of etched epitaxial region 101, while oxide region 102b covers the other side of epitaxial region 101. Oxide region 102 also covers the top surface of N+ substrate 100 in each of the trenches.

The dielectric material may be introduced into the trenches using a variety of well-known methods. For instance, regions 102 may be grown thermally, deposited by chemical vapor deposition, and/or spun on in liquid form. For a given width of the mesa formed from epitaxial layer material 101, the width of the dielectric layer may be set to provide a required breakdown voltage, with wider dielectric layers providing a higher Vbd. In one implementation, the device structure of FIG. 5 has an oxide layer width of 4 μm. For devices with other $V_{bd}$ performance, this thickness may be in the range of about 2 μm-5 μm.

Figure 5D:
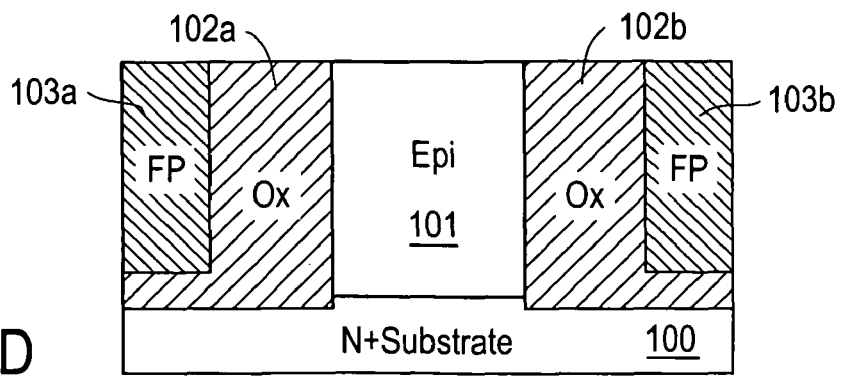

FIG. 5D illustrates the device structure of FIG. 5C following the steps of filling the remaining portions of the trenches with a conductive material and planarizing the surface to form field plate regions 103. For example, the conductive material may comprise a heavily doped polysilicon, a metal (or metal alloys), and/or silicide. Conductor regions 103a and 103b form the field plate members of the device. In most cases, field plate members 103a and 103b should be made as narrow as can be reliably manufactured, since the field plate members occupy silicon area without directly contributing to device conductivity or breakdown voltage characteristics. In one embodiment, the width of field plate members 103 is approximately 0.5 μm-3.0 μm. The planarization of the surface may be performed by conventional techniques such as etch-back and/or chemical-mechanical polishing.

At this point in the process, fabrication of the extended drain region of the device is essentially complete. The remaining processing steps may be adapted to produce a stand-alone, high-voltage, depletion-mode MOSFET device structure (as shown in FIG. 5G and FIG. 6) or a high-voltage FET that incorporates a low-voltage MOSFET structure (e.g., FIG. 5K), or other high-voltage devices.

Figure 5E:
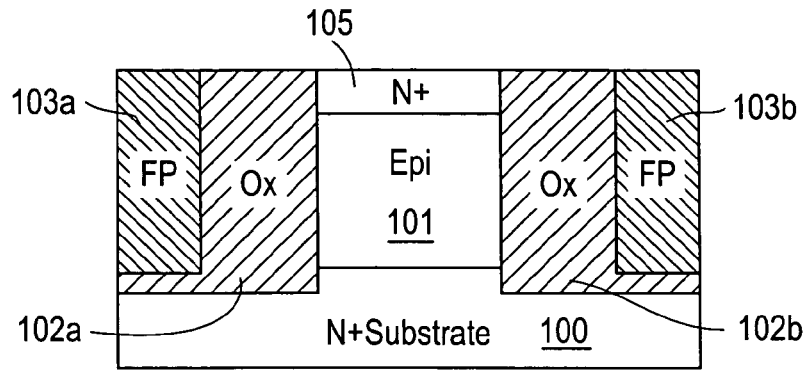

FIG. 5E is a cross-sectional side view of the device structure of FIG. 5D after the introduction of an N+ source region 105 at the top surface of epitaxial layer 101. Source region 105 may be formed using ordinary deposition, diffusion, and/or implantation processing techniques.

After formation of the N+ source region 105 an interlevel dielectric layer 106 if formed over the device. In the embodiment of FIG. 5, interlevel dielectric layer 106 may comprise ordinary silicon dioxide and/or another material that may be deposited and patterned by conventional methods. Openings are formed in dielectric layer 106 and one or more conductive materials (e.g., metal, silicide, etc.) are deposited and patterned to produce the structure shown in FIG. 5F. In this cross-sectional view, source electrode 109 provides electrical connection to N+ source region 105, and electrodes 110a and 110b provide electrical connection to field plate members 103a and 103b, respectively.

Figure 5F:
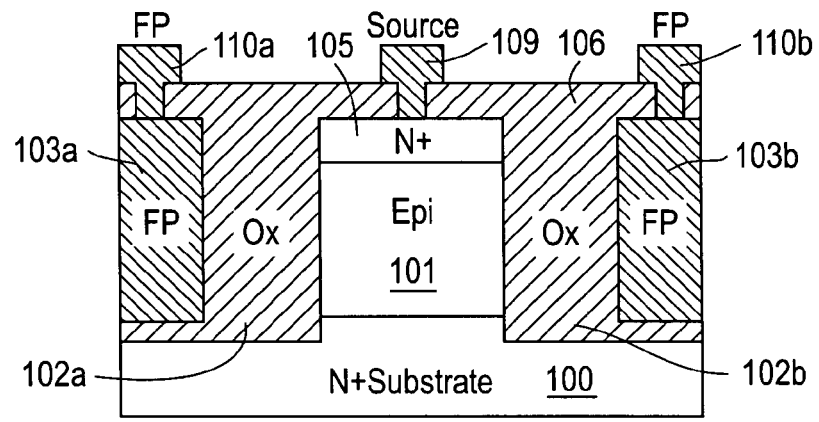
Figure 5G:
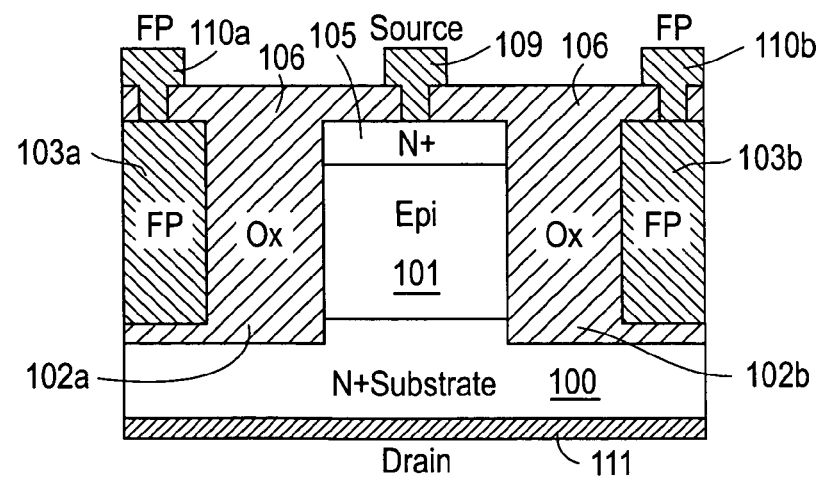
Figure 5H:
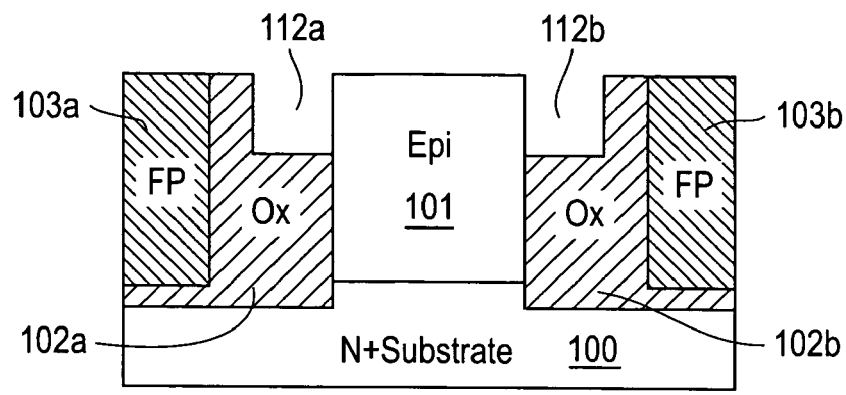
Figure 6:
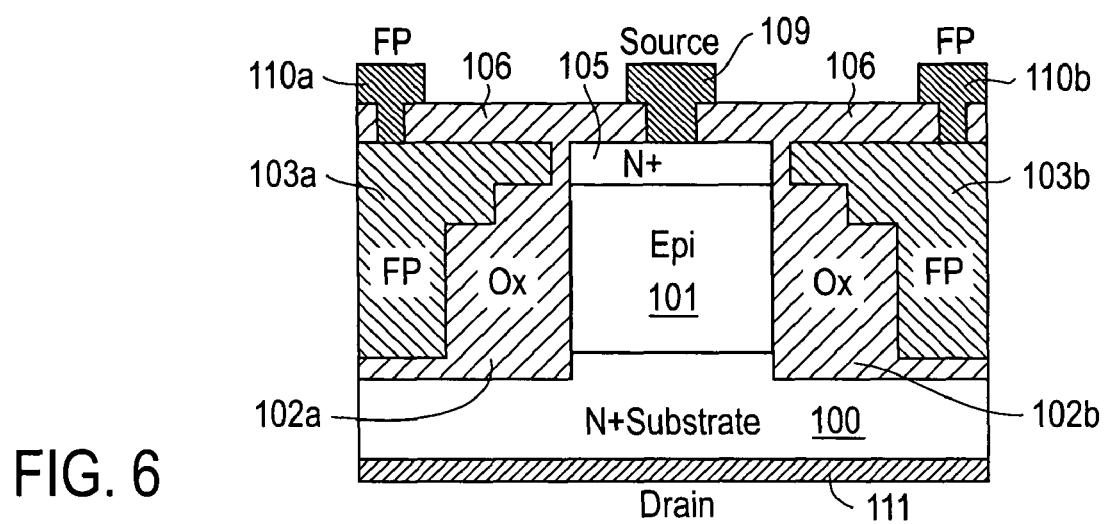
FIG. 6 is a cross-sectional side view of still another embodiment of a vertical HVFET device structure fabricated according to the present invention.

FIG. 5G shows the device structure of FIG. 5F following formation of a drain electrode 111 on the bottom of N+ substrate 100. For example, drain electrode 111 may be formed using the conventional technique of metal sputtering. As described earlier, the bottom of the substrate may first be subjected to grinding, implanting, etc., to lower the drain contact resistance.

The device of FIG. 5G represents a completed high-voltage transistor having a stand-alone drift region; that is, the device of FIG. 5G does not include a low-voltage, series MOSFET structure at the top of the epitaxial layer. Instead, the extended drift region formed by the epitaxial layer, itself, performs the function of the MOSFET without the inclusion of a P-body region. Practitioners in the arts will note that in this device structure current cannot be completely turned-off, since there exists a continuous n-type path for electrons to flow from source electrode 109 to drain electrode 111. Current flow in the device structure of FIG. 5G, however, does saturate when the mesa-like epitaxial layer 101 is pinched-off at high drain voltages.

The device structure of FIG. 6 achieves pinch-off of the extended drain region at lower voltages than the device of FIG. 5G. This is achieved by reducing the spacing between the field plate members 103 and epitaxial layer 101 near the top of the N-type drift region, thereby increasing the capacitance to pinch-off the vertical drift region at a relatively low voltage. FIG. 6 shows a multi-tiered field plate structure extending laterally into oxide regions 102a & 102b to control the pinch-off voltage and, therefore, the saturation current. Alternatively, the field plate members may comprise a single step, a linearly graded lateral extension, or some other profile shape designed to achieve the same result.

Those skilled in the arts will appreciated that for certain circuit applications it may be advantageous to utilize the stand-alone transistor structure of FIG. 5G (or FIG. 6) in series with an ordinary external, low-voltage switching MOSFET. In such an application the low-voltage (e.g., 40V) MOSFET could be used for switching purposes in order to completely turn off current flow in the high-voltage (e.g., 700V) transistor device.

Referring now to FIGS. 5H-5K, there is shown an alternative processing sequence that may be used to fabricate a vertical HVNMOS transistor that includes an insulated gate MOS structure.

Trenches 112a and 112b are formed in respective dielectric layers 102a and 102b on opposite sides of epitaxial layer 101 to accommodate the formation of the insulated gate structure. The depth of trenches 112a and 112b extends from the surface of epitaxial layer 101 to a depth governed by the intended MOSFET channel length and field plating considerations. In this example, the trench depth is about 1 μm-5 μm. By way of example, trenches 112 may be formed by appropriate application of a patterned masking layer to the semiconductor substrate followed by conventional dry or wet etching techniques into oxide layer 102.

Figure 5I:
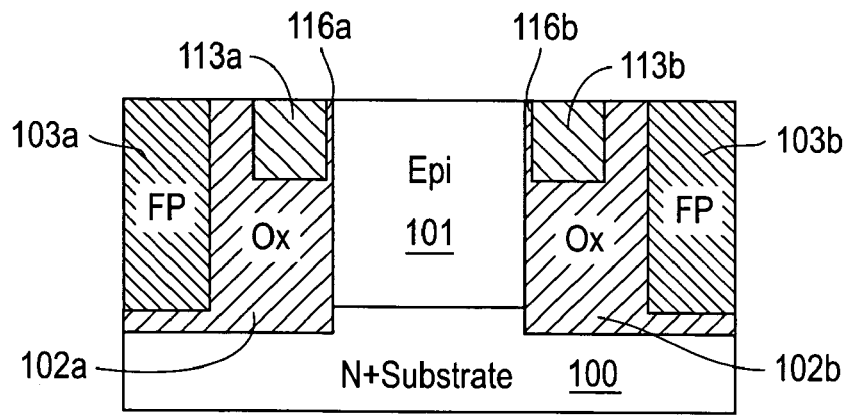

FIG. 5I shows the device after formation of gate dielectric layers 116 and gate members 113 within trenches 112. The gate dielectric layers 116a & 116b may be formed by growing or depositing oxide on the sidewalls of the exposed epitaxial layer 101. The device threshold voltage and other device performance targets determine the thickness of layers 116. In one embodiment, layers 116 comprise silicon dioxide having a thickness on the order of 250-1000 angstroms.

In the embodiment shown, a portion of dielectric layer 102 isolates field plate members 103 from gate members 113. Alternatively, trenches 112 may expose the top portion of field plate 103 and the same processing steps used to create layers 116 may also be used to form dielectric layers on the sidewalls of the field plates to isolate the field plates from the gate members.

Once dielectric layers 116 have been formed on the sidewalls of trenches 112, a conductive material, such as doped polysilicon, may be deposited to fill the remaining portions of the trenches. In this implementation, the doped polysilicon forms the gate members 113a and 113b of the MOS transistor structure. In the embodiment of FIG. 5I, the surface has been planarized using conventional etch-back and/or CMP techniques.

Figure 5J:
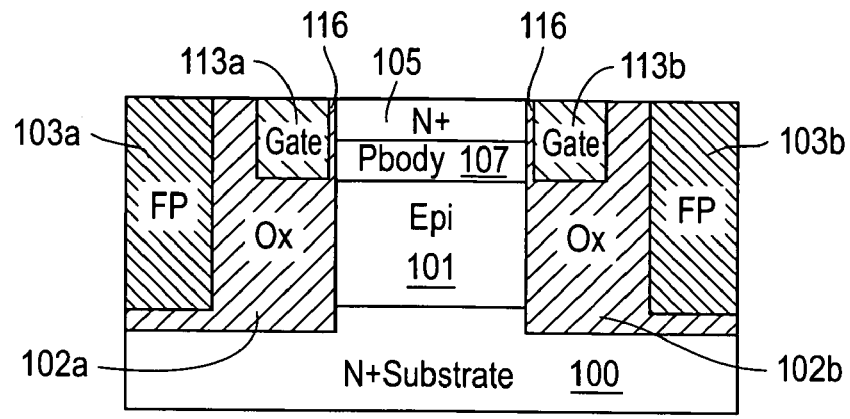

FIG. 5J shows the device after introduction of a P-body region 107 and a N+ source region 105 at the top surface of epitaxial region 101. Regions 107 and 105 may be formed using standard implantation, deposition, and/or thermal diffusion processing steps. In the completed device, application of a sufficient voltage to gate members 113 causes a conductive channel to be formed along the sidewall portions of P-body region 107 between N+ source region 105 and epitaxial region 101. The channel length is therefore determined by the depth of P-body region 107, and N+ source region 105. For the particular embodiment shown the former may be approximately 0.5 μm-3.0 μm, and the latter in the range of about 0.1 μm-0.5 μm. A shorter channel length results in a lower channel resistance, which likewise reduces the on-resistance of the device. It should be understood, however, that a too short channel would cause punch-through problems. In other embodiments, the P-body and/or N+ source may be formed earlier in the process, for example before the trench etching of the epitaxial layer 101, or before the trench etching of the oxide layer 102.

Figure 5K:
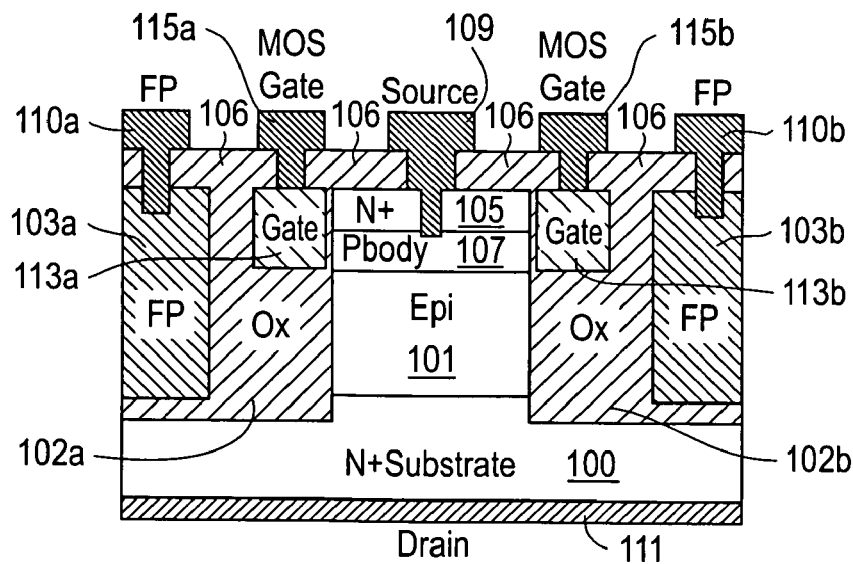

FIG. 5K shows the completed HVFET device structure following formation of an interlevel dielectric layer 106 (e.g., silicon dioxide, silicon nitride, etc.). This layer may be deposited and patterned to form contact openings. In the embodiment shown, the etching of layer 106 is followed by etching of the field plates, gate members, N+ and P-body regions. This is followed by deposition and patterning of one or more conductive layers (e.g., metal, silicide, etc.) to create source electrode 109, gate electrodes 115, and field plate electrodes 110, which provide electrical connection to the respective regions of the device. The optional etching step described above allows the source electrode to contact the P-body region without patterning the N+ source region, thus simplifying the process. An additional P-type doping process may also be included for improved contact to the P-body. A conductive layer may also be applied to the bottom of substrate 100 (after optional treatment by grinding, etching, implanting, etc.) to form the drain electrode 111.

Note that while source electrode 109 is shown extending down to P-body 107 in the cross-sectional view of FIG. 5K, in other embodiments electrode may only extend to the upper surface of source region 105.

One feature of the structures shown in FIGS. 1 and 4-6 is that the field plates separate the drift regions from the perimeter area of the HVFET. The perimeter areas of the substrate are typically at the substantially the same potential as the drain electrode, which, in the case of a vertical transistor device structure, is usually located on the bottom surface of the silicon substrate. Conversely, the field plates are at substantially the same potential as the source electrode (e.g., ground). In these device structures, the dielectric material separating the perimeter area from the field plates is made thick enough to support the large potential difference (e.g., 200V-1200V, depending on the rated breakdown voltage of the HVFET) between the drain and the source.

Figure 7:
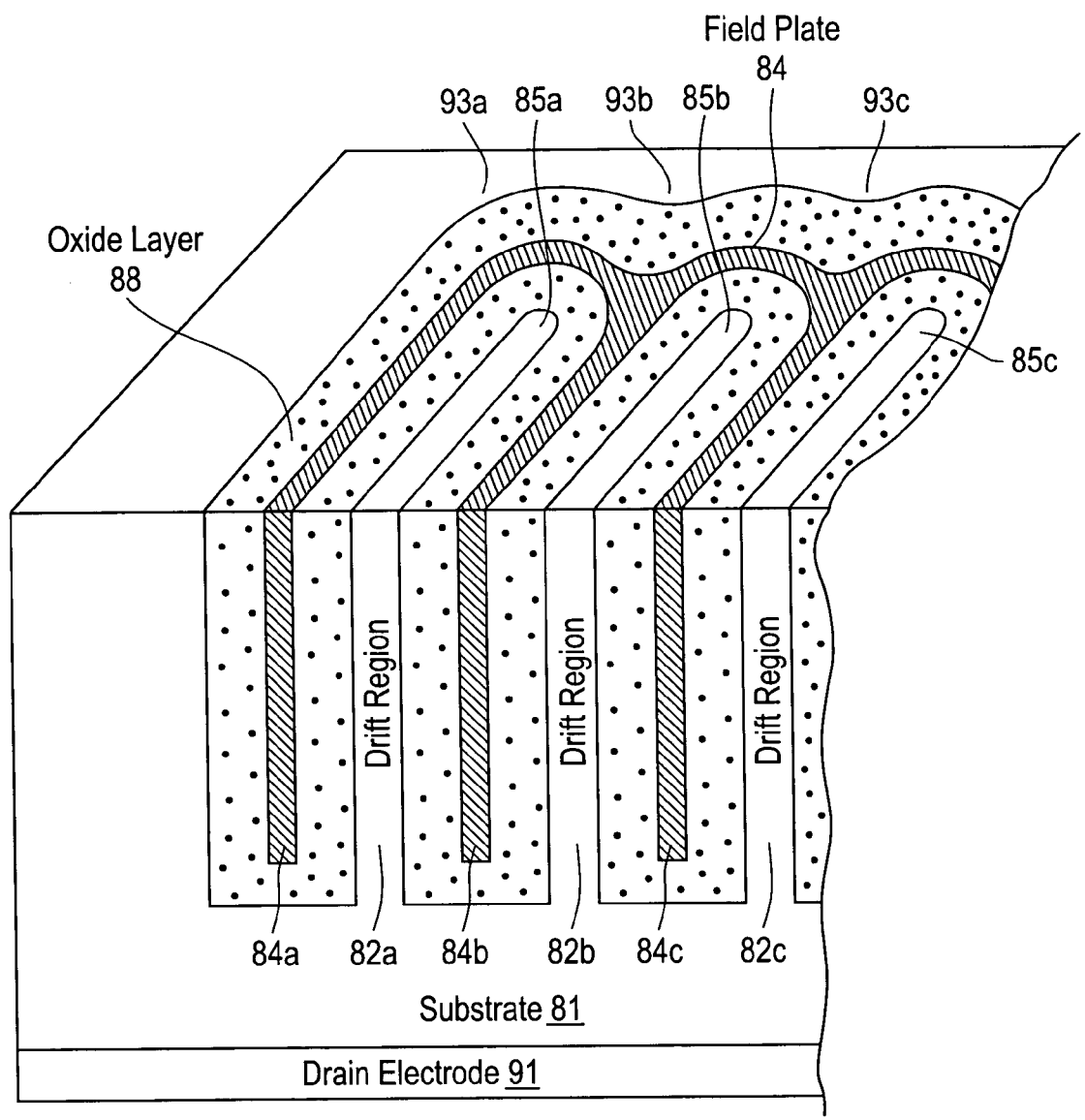
FIG. 7 is a cross-sectional perspective view of a vertical HVFET device with an edge termination structure according to one embodiment of the present invention.

Referring now to FIG. 7, there is shown a cross-sectional perspective view of a vertical HVFET device with an edge termination structure according to one embodiment of the present invention. Note that the device structure shown in FIG. 7 is a generic form of the structures previously shown in FIGS. 1, 4, 5G, 5K, and 6, with the gate, source and/or body structures omitted for clarity. For reasons of clarity, the top metallization layer (e.g., source electrode) is also not shown. A bottom drain electrode 91 that provides electrical connection to substrate 81, which forms the drain semiconductor region of the device, is shown. The dielectric regions 88 are also depicted with a different fill pattern for better contrast. It should be understood that any of the edge termination structures shown in FIGS. 7-10 may be utilized with any of the device structures shown in FIGS. 1, 4, 5G, 5K, and 6, as well as with similar device structure embodiments.

In the embodiment of FIG. 7, drift regions 82 comprise long, narrow mesa regions that terminate abruptly at the edge of the HVFET. As can be seen, each of the drift regions 82 terminates in the lateral direction (into the page) in a rounded, semi-circular fingertip area 85. The dielectric region 88 (e.g., oxide) wraps-around each of fingertip areas 85 such that each fingertip area 85 is laterally surrounded by region 88. Similarly, adjacent field plates 84 connect with each other by wrapping-around each fingertip area 85. In this manner, a single, interconnected field plate member 84 is formed. The separation distance between field plate 84 and each of the drift regions 82 is substantially the same for all points along the edge of drift regions 82. That is, field plate 84 is substantially equidistant from each drift region, including all tangential points around fingertip area 85.

Field plate 84 is fully insulated by dielectric region 88, with the outer side of field plate 84 (facing opposite the drift regions) being insulated from substrate 81, which comprises the drain semiconductor material. Note that in this embodiment, the outer lateral edge 93 of dielectric 88, which forms the boundary between dielectric region 88 and substrate 81, follows the contour of the connecting portions of field plate 84, i.e., the curved portion which connects field plate members 84a & 84b, 84b & 84c, etc. For example, the curved corner area 93a follows the semicircular shape of the field plate portion that connects members 84a & 84b. Likewise, the indented portions 93b & 93c follow the indented areas of field plate 84 at the ends of members 84b & 84c, respectively. In this way, a cross-section of the edge termination structure as taken across field plate 84 from any point along the edge of a drift region 82 to a corresponding orthogonally-facing point of the lateral outer edge 93 of dielectric 88 is substantially symmetrical.

In one implementation of the structure shown in FIG. 7, each of the drift regions 82 has a width in the range of 0.4 µm to 3 µm, with a field plate width in a range of 1 µm to 3 µm, and a dielectric width (on either side of field plate 84) in a range of 2 µm to 5 µm. These same dimensions may apply to the other embodiments discussed below. Thus, an HVFET fabricated in accordance with the present invention may have an edge termination area—defined as the distance between the edge of an outermost drift region to the scribe area of the die—of about 13 µm or less.

Figure 8:
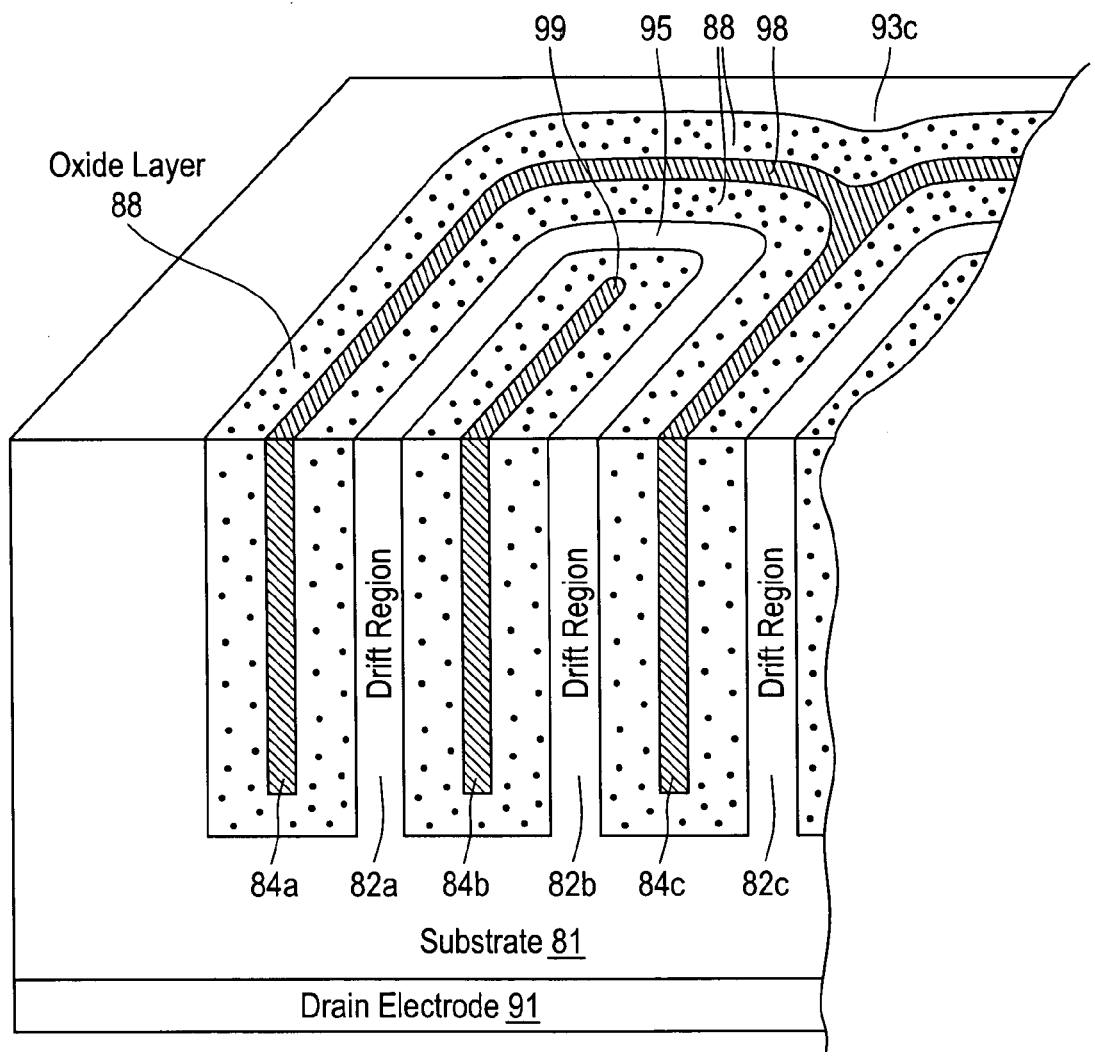
FIG. 8 is a cross-sectional perspective view of a vertical HVFET device with an edge termination structure according to another embodiment of the present invention.

Another embodiment of an edge termination structure that mitigates electric field crowding in accordance with the present invention is shown in the cross-sectional perspective view of FIG. 8, in which pairs of the narrow mesa drift regions 82 are joined or connected at the ends. By way of example, FIG. 8 shows elongated drift regions 82*a* & 82*b* connected at the lateral end by a region 95. Drift regions 82*c* & 82*d* (not shown) are similarly connected together at the lateral edge of the transistor. In this embodiment, field plate member 84*b* terminates abruptly in a fingertip area 99 at the edge of the HVFET, while field plate members 84*a* & 84*c* are connected at the edge of the HVFET by a field plate region 98. The connected field plate members 84*a* & 84*c* also connect with every second, i.e., alternate, field plate member in the HVFET. Each alternate field plate member that is not connected together (e.g., members 84*b*, 84*d*, etc.) terminates abruptly in a fingertip area 99 at the edge of the HVFET. As before, dielectric layer 88 surrounds both sides of the field plate members and includes curved corner areas and indented portions (e.g., 93*c*) that follow the shape of the connecting field plate region 98. In this way, every cross-section of the edge termination structure shown in FIG. 8, taken through the shortest line from one field plate member through a drift region to the next field plate member, is substantially the same.

Figure 9:
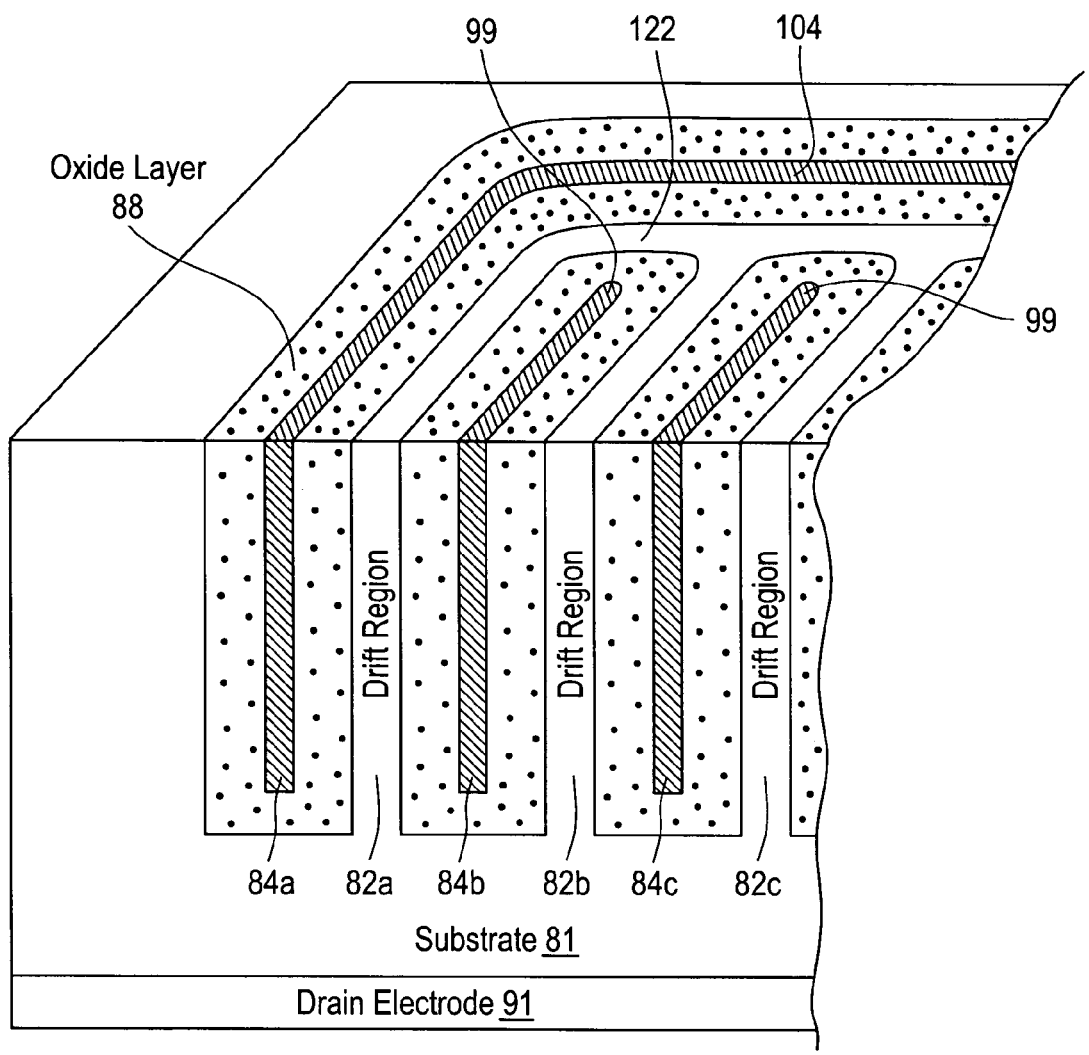
FIG. 9 is a cross-sectional perspective view of a vertical HVFET device with an edge termination structure according to still another embodiment of the present invention.

FIG. 9 is a cross-sectional perspective view of a vertical HVFET device with an edge termination structure according to another embodiment of the present invention. The edge termination structure of FIG. 9 is similar to that shown in FIG. 8, except that instead of connecting pairs of drift regions 82 together at the lateral ends, the embodiment of FIG. 9 connects all of the drift regions 82 together with a lateral connecting region 122. All of the interior field plate members, i.e., 84*b*, 84*c*, etc., terminate abruptly in a fingertip area 99 at the lateral edge of the HVFET. The outer two field plate members (i.e., 84*a* and the other outer field plate member not shown) are connected together at the edge of the HVFET by a field plate region 104. Thus, in the embodiment of FIG. 8, the outermost field plate members are connected to form a contiguous ring that completely encircles the interior drift regions 82 and interior field plate members. (The words "ring" and "encircle" in this context do not necessarily mean that the field plate is circular or oval in shape or pattern. In the context of the present application, the words "ring" and "encircle" are intended to denote any laterally surrounding shape or pattern, be it circular, oval, rectilinear, etc.)

Figure 10:
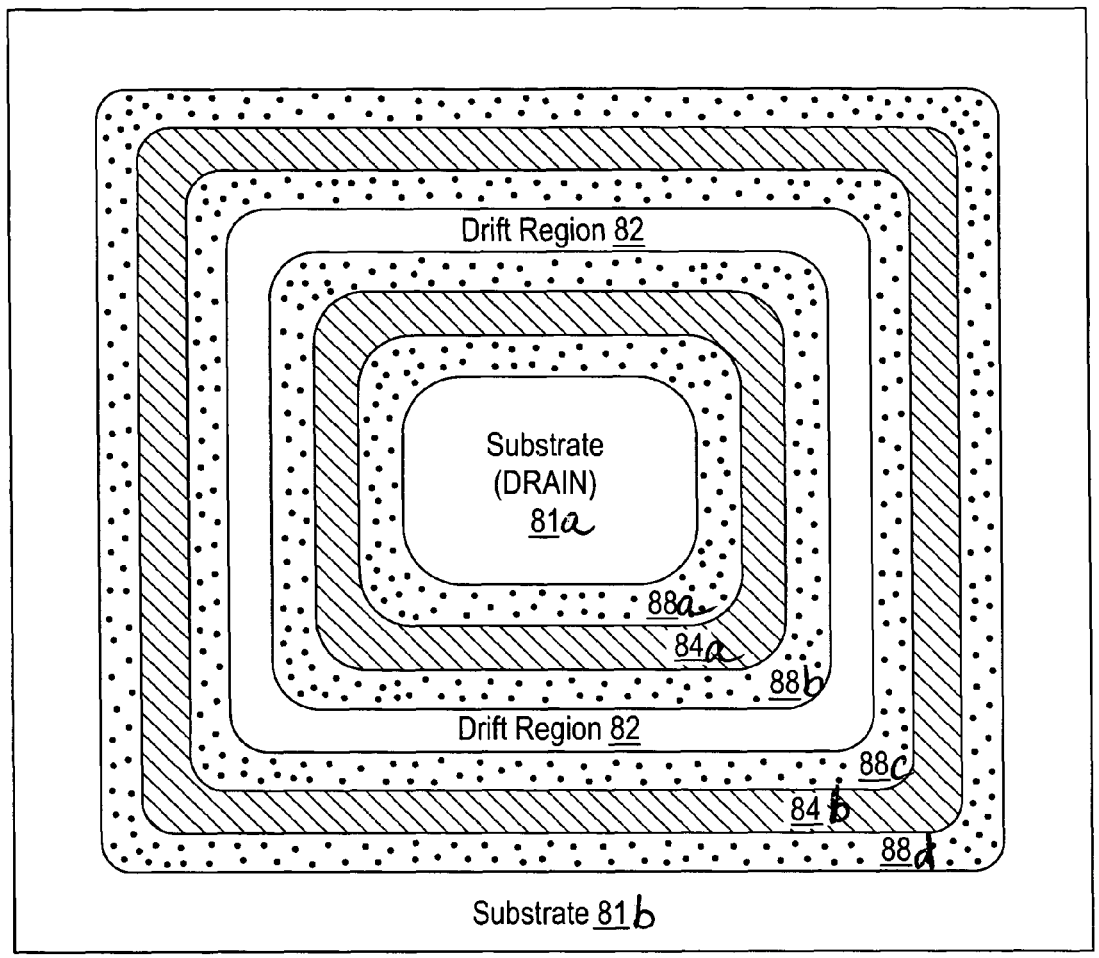
FIG. 10 is a top view of a vertical HVFET device with an edge termination structure according to yet another embodiment of the present invention.

FIG. 10 is a top view of a vertical HVFET device with an edge termination structure according to yet another embodiment of the present invention. In this embodiment, each of the drift regions 82, dielectric regions 88, and field plate members 84 are formed as contiguous regions that are arranged in a concentric manner. For example, contiguous dielectric region 88*a* concentrically encircles interior drain substrate region 81*a*, contiguous field plate member 84*a* concentrically encircles dielectric region 88*a*, contiguous dielectric region 88*b* concentrically encircles field plate member 84*a*, contiguous drift region 82 concentrically encircles dielectric region 88*b*, contiguous dielectric region 88*c* concentrically encircles drift region 82, contiguous field plate member 84*b* concentrically encircles dielectric region 88*c*, contiguous dielectric region 88*d* concentrically encircles dielectric region 88*b*, and exterior drain substrate region 81*b* concentrically encircles dielectric region 88*b*.

It is appreciated that the concentric regions described above may begin with an interior drain substrate region 81*a*, i.e., at the center of the HVFET, that is circular or oval in shape. The minimum radius of curvature at the edges or corner areas may be set to avoid high electric fields. Regardless of the shape of the innermost substrate region 81*a*, the contiguous regions may progressively become more square or rectangular in shape moving toward the outermost substrate region 81*b*. Furthermore, although the embodiment of FIG. 10 illustrates a single drift region 82, the device structure is not limited in this regard; rather, there may be multiple, contiguous drift regions, each one progressively larger than the previous one moving toward the outer edge of the HVFET.

Although the present invention has been described in conjunction with specific embodiments, those of ordinary skill in the semiconductor device and fabrication arts will appreciate that numerous modifications and alterations are well within the scope of the present invention. Accordingly, the specification and drawings are to be regarded in an illustrative rather than a restrictive sense.

I claim:
1. A high-voltage transistor comprising:
   a substrate having a top surface;
   a drain of a first conductivity type;
   a plurality of source regions of the first conductivity type;
   a plurality of drift regions of the first conductivity type, each extending in a vertical direction from the drain toward the source, adjacent ones of the drift regions being separated in a first lateral direction by a dielectric layer, each of the drift regions terminating in a second lateral direction in a fingertip area;
   a plurality of body regions of a second conductivity type, each body region separating a corresponding one of the source regions from a corresponding one of the drift regions;
   a field plate member disposed within the dielectric layer that surrounds each of the drift regions in the first and second lateral directions, the field plate member having an entire length that extends in the vertical direction from a beginning at the top surface of the substrate downward to a farthest end of the field plate member, an inner region of the dielectric layer laterally separating the drift regions from the field plate member and an outer region of the dielectric layer laterally separating the field plate member from a perimeter semiconductor region of the substrate that extends in the vertical direction downward from the top surface, the perimeter semiconductor region being of the first conductivity type, the inner and outer regions each having a width that is substantially the same at all points along the entire length of the field plate member; and
   a plurality of gates, each gate being disposed in the dielectric layer adjacent to and insulated from a corresponding one of the body regions, application of a voltage potential to the gate causing a vertical conduction channel to form in the body region such that current flows between the source regions and the drain when the high-voltage transistor is in an on-state.
2. The high-voltage transistor according to claim 1 wherein the fingertip area has a rounded shape.

3. The high-voltage transistor according to claim 1 wherein each of the drift regions has a width in the first lateral direction that is substantially equal.

4. The high-voltage transistor according to claim 1 wherein the width of the inner and outer regions is substantially the same at all points in the first and second lateral directions.

5. The high-voltage transistor according to claim 1 wherein the substrate comprises a planar bottom surface, the vertical direction being oriented perpendicular to the planar bottom surface and the lateral direction being oriented parallel to the planar bottom surface.

6. The high-voltage transistor according to claim 1 wherein each of the drift regions have a length oriented in the vertical direction and a width oriented in the first lateral direction, the length being more than five times the width.

7. The high-voltage transistor according to claim 1 wherein the first conductivity type comprises n-type.

8. The high-voltage transistor according to claim 1 wherein the field plate member extends in the vertical direction, oriented substantially parallel to the drift regions.

9. A high-voltage transistor comprising:
a substrate having a top surface;
a drain of a first conductivity type;
a source of the first conductivity type;
a body region of a second conductivity type opposite to the first conductivity type, the body region adjoining the source region, a conductive channel being formed in the body region when the high-voltage transistor is in an on-state such that current flows between the source and drain;
a drift region of the first conductivity type extending in a vertical direction from the drain to the body region;
a field plate member that laterally encircles the drift region, the field plate member being disposed in a dielectric layer, the field plate member having an entire length that extends in the vertical direction from a beginning at the top surface of the substrate downward to a farthest end of the field plate member, an inner region of the dielectric layer laterally separating the drift region from the field plate member and an outer region of the dielectric layer laterally separating the field plate member from a perimeter semiconductor region of the substrate that extends in the vertical direction downward from the top surface, the inner and outer regions each having a width that is substantially the same at all points along the entire length of the field plate member; and
an insulated gate disposed in the inner region of the dielectric layer adjacent the body region, application of a voltage potential to the insulated gate causing the conduction channel to form in the body region.

10. The high-voltage transistor according to claim 9 wherein the drift region extends in a lateral direction, terminating at each end in a rounded fingertip area.

11. The high-voltage transistor according to claim 10 wherein the substrate comprises a planar bottom surface, the vertical direction being oriented perpendicular to the planar bottom surface and the lateral direction being oriented parallel to the planar bottom surface.

12. The high-voltage transistor according to claim 9 wherein the perimeter semiconductor region extends from the top surface to a drain electrode formed on a bottom surface of the substrate.

13. The high-voltage transistor according to claim 9 wherein the perimeter semiconductor region is laterally separated from the field plate member by a distance that is substantially the same at all points along an outer edge of the field plate member.

14. The high-voltage transistor according to claim 9 wherein the drift region has a length oriented in the vertical direction and a width oriented in a first lateral direction, the length being more than five times the width.

15. A power transistor comprising:
a substrate having a top surface, an active device area, and a perimeter area of a first conductivity type, the active device area including:
a drain region of the first conductivity type;
a plurality of source regions of the first conductivity type, each source region being disposed at or near the top surface of the substrate;
a plurality of body regions of a second conductivity type, each body region being disposed beneath a corresponding one of the source regions; and
a plurality of drift regions of the first conductivity type extending in a vertical direction from a corresponding one of the body regions downward to the drain region, adjacent ones of the drift regions being separated in a first lateral direction by a dielectric layer, each of the drift regions terminating in a second lateral direction in a fingertip area;
a field plate member disposed within the dielectric layer that surrounds each of the drift regions in the first and second lateral directions, the field plate member having an entire length that extends in the vertical direction from a beginning at the top surface of the substrate downward to a farthest end of the field plate member, an inner region of the dielectric layer laterally separating the drift regions from the field plate member and an outer region of the dielectric layer laterally separating the field plate member from the perimeter area of the substrate, the inner and outer regions each having a width that is substantially the same at all points along the entire length of the field plate member, the perimeter area being laterally separated from the field plate member by a distance that is substantially the same at all points along an outer edge of the field plate member;
a gate disposed in the dielectric layer between a corresponding one of the body regions and the field plate member, application of a voltage potential to the gate causing a vertical conduction channel to form in the body region such that current flows between the source regions and the drain when the high-voltage transistor is in an on-state.

16. The power transistor of claim 15 wherein the perimeter area extends from the top surface to a drain electrode formed on a bottom surface of the substrate.

17. The power transistor of claim 15 wherein the substrate comprises a planar bottom surface, the vertical direction being oriented perpendicular to the planar bottom surface and the lateral direction being oriented parallel to the planar bottom surface.

18. The power transistor of claim 15 wherein the drift region has a length oriented in the vertical direction and a width oriented in a first lateral direction, the length being more than five times the width.

19. The power transistor of claim 15 wherein the perimeter area comprises a semiconductor region of the first conductivity type.

* * * * *